United States Patent
Duparré

(10) Patent No.: US 8,184,195 B2
(45) Date of Patent: May 22, 2012

(54) LENS SHIELDING STRUCTURES FOR DIGITAL IMAGE SENSORS

(75) Inventor: Jacques Duparré, Jena (DE)

(73) Assignee: Aptina Imaging Corporation, George Town (KY)

( * ) Notice: Subject to any disclaimer, the term of this patent is extended or adjusted under 35 U.S.C. 154(b) by 431 days.

(21) Appl. No.: 12/416,887

(22) Filed: Apr. 1, 2009

(65) Prior Publication Data

US 2010/0253832 A1    Oct. 7, 2010

(51) Int. Cl.
*H04N 5/225* (2006.01)
*G03B 17/00* (2006.01)

(52) U.S. Cl. ........................... 348/340; 396/448
(58) Field of Classification Search ............. 348/335, 348/340; 396/448, 535; 438/65; 358/819; 257/432–433; 359/819
See application file for complete search history.

(56) References Cited

U.S. PATENT DOCUMENTS

| | | | |
|---|---|---|---|
| 6,104,887 A | 8/2000 | Hamasaki et al. | |
| 6,995,911 B2 | 2/2006 | Boettiger | |
| 7,268,335 B2 | 9/2007 | Hiltunen | |
| 7,329,861 B2 | 2/2008 | Ma et al. | |
| 7,528,880 B2 * | 5/2009 | Yamaguchi et al. | 348/335 |
| 2007/0096235 A1 | 5/2007 | Boettiger et al. | |
| 2007/0120212 A1 | 5/2007 | Boettiger et al. | |
| 2008/0019026 A1 * | 1/2008 | Feng et al. | 359/819 |
| 2009/0243012 A1 * | 10/2009 | Vanam et al. | 257/432 |

OTHER PUBLICATIONS

Aptina Imaging Introduction, 39 pages, 2008.
"Toshiba Brings New Image Sensors and Camera Modules to Mobile Handset Market", Toshiba press release, [online], [retrieved on Apr. 1, 2009], <URL:http://www.toshiba.com/taec/news/press_releases/2008/wris_08_521.jsp>, Apr. 1, 2008.
"Ultra small reflowbale UXGA camera module", STMicroelectronics, VW6754 Data Sheet, Feb. 2008.

* cited by examiner

*Primary Examiner* — W. B. Perkey
*Assistant Examiner* — Minh Phan
(74) *Attorney, Agent, or Firm* — Treyz Law Group; G. Victor Treyz; David C. Kellogg

(57) ABSTRACT

Camera modules are provided using wafer level optics structures. Wafers of optical stack components such as spacers, lenses, filters, and aperture layers may be combined to form optical stacks for camera modules. Each optical stack may be formed from pieces of the lens and spacer wafers. The optical stacks may be mounted above digital image sensors to form compact camera modules for devices such as cellular telephones and digital cameras. To reduce lens flare, a lens hood structure may be mounted above the outermost lens in the optical stack structure. The lens hood structure may be formed from a layer of opaque plastic having an inner surface and an outer surface. The layer of plastic may be provided as part of a camera module housing or as a separate structure. A noncircular lens hood aperture may be formed in the outer surface of the lens hood layer. A corresponding inner aperture may be formed in the inner surface of the lens hood layer adjacent to the optical stack structure. The noncircular exterior surface aperture of the lens hood may have a barrel shape, a rectangular shape, an oval shape, a pincushion shape, or other suitable shapes that help reduce flare for digital image sensors with rectangular active areas.

20 Claims, 9 Drawing Sheets

LENS SHIELDING STRUCTURES FOR DIGITAL IMAGE SENSORS

BACKGROUND

The present invention relates to image sensors and, more particularly, to lens shielding structures for image sensors.

Modern electronic devices such as cellular telephones, cameras, and computers often use digital image sensors. Compact camera modules may be produced using wafer-scale processing. In a typical water level optics arrangement, image sensors are fabricated from a silicon wafer. Wafers of glass and other substances are used to form lenses and support structures. Camera modules may be formed by mating one or more wafers of optical, components such as lenses with a wafer of associated digital image sensors. During packaging operations, the wafers are separated into, individual sensors and are mounted in corresponding, plastic packages. Forming camera modules in this way can be highly economical, because wafer-level mass production techniques allow many sensors and associated lenses to be formed in parallel.

To reduce flare and thereby improve image quality, cameras are often provided with lens hoods. For example, cone-shaped and petal-shaped lens hoods are sometimes mounted to the lenses of single lens reflex cameras. Camera modules that are formed using wafer level optics and wafer level packaging arrangements are also sometimes provided with light shielding structures that serve as miniatures lens hoods. These, structures generally have a truncated cone shape having a wider circular end and a narrower circular end. The narrower circular end of the cone is formed adjacent to the outermost lens in the camera module. The wider circular end of the cone forms an exit aperture.

Although conventional lens shielding structures such as these may help improve optical performance by reducing lens flare, it is not always possible to reduce flare as much as desired.

DETAILED DESCRIPTION

Wafer-level optics can be used in forming compact digital camera modules. In a typical scenario, camera, module components such as image sensors and lenses can be formed from wafers of material. The wafers are generally many inches in diameter and about a fraction of a millimeter to several millimeters in thickness. Because sensors are typically only a fraction of an inch wide, numerous image sensors can be formed from a single silicon wafer. Similarly, numerous matching tenses can be formed from a single wafer of glass or other transparent material.

Figure 1A:
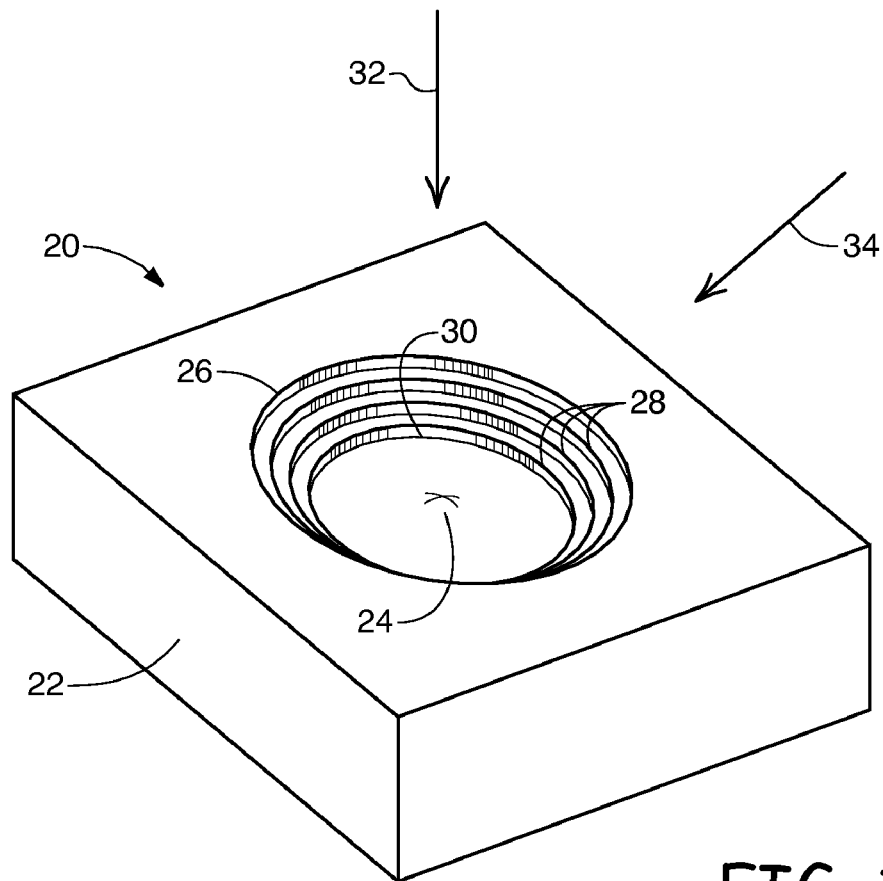
FIG. 1A is a perspective view of a camera module with a conventional lens shielding structure.

Once the layers of optical components such as lenses and the sensors have been fabricated, individual camera modules can be created by dividing up the wafers and packaging individual sensors and lens stacks in corresponding packages. A perspective view of a conventional camera module 20 is shown in FIG. 1A. As shown in FIG. 1A, camera module 20 may have a housing 22. Housing 22 may be formed from an opaque plastic. The image sensor may be mounted at the bottom of housing 22. Light may enter lens 24 of camera module 20 in direction 32. To avoid lens flare, module 20 may be provided with a lens shielding structure that blocks off-axis light such as light approaching from direction 34. In the arrangement of FIG. 1A, the lens shielding structure is formed by the step-shaped side/walls 28 of module 20 that surround lens 24. The lens shielding structure is roughly conical in shape. The lower portion of the conical lens shielding structure has a circular opening 30 (sometimes interred to as the lens-side aperture or lens aperture). At the surface of module 20, the lens shielding structure has a wider, circular opening 26 (sometimes referred to as the exit aperture). Because the lens shielding structure is conical in shape, the diameter of lens aperture 30 is less than the diameter of exit aperture 26.

The lens shielding structure of FIG. 1A serves as a miniature lens hood for camera module 20 and thereby can improve optical performance by reducing lens flare. However, the radially symmetric conical shape of conventional lens shielding structures of this type does not produce optimal results, particularly, when the image sensor in the camera module is not circular (e.g., when the image sensor is rectangular with sides of unequal length).

Figure 1B:
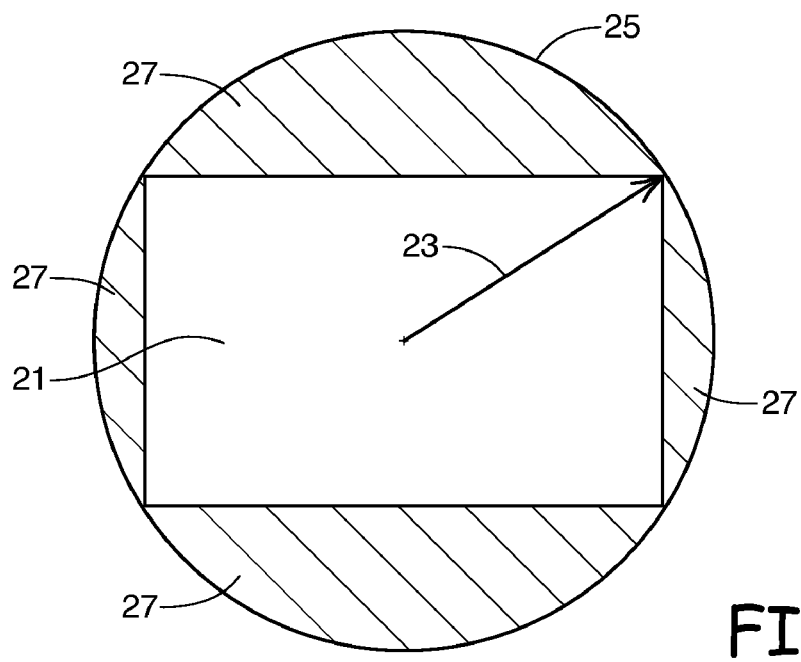
FIG. 1B is a diagram showing how a substantial portion of the light transmitted by a conventional circular lens hood in a camera module with a rectangular image sensor is tin desired.

A diagram showing the area covered by the incoming light in a camera module with a conventional circular lens hood, is shown in FIG. 1B. As shown in FIG. 1B, incoming light is being provided to a rectangular image sensor 21. Because the lens hood is circular, the incoming light is projected in a circle (circle 25). The angle of view of the conventional circular lens hood must be sufficiently large to cover diagonal dimension 23 of sensor 21. This results in excess incoming light in regions 27, because of the mismatch between the field of view associated with the circular lens hood and the rectangular shape of image sensor 21. The excess incoming light associated with regions 27 represents stray light that can result in flare in the camera module lens.

Figure 2:
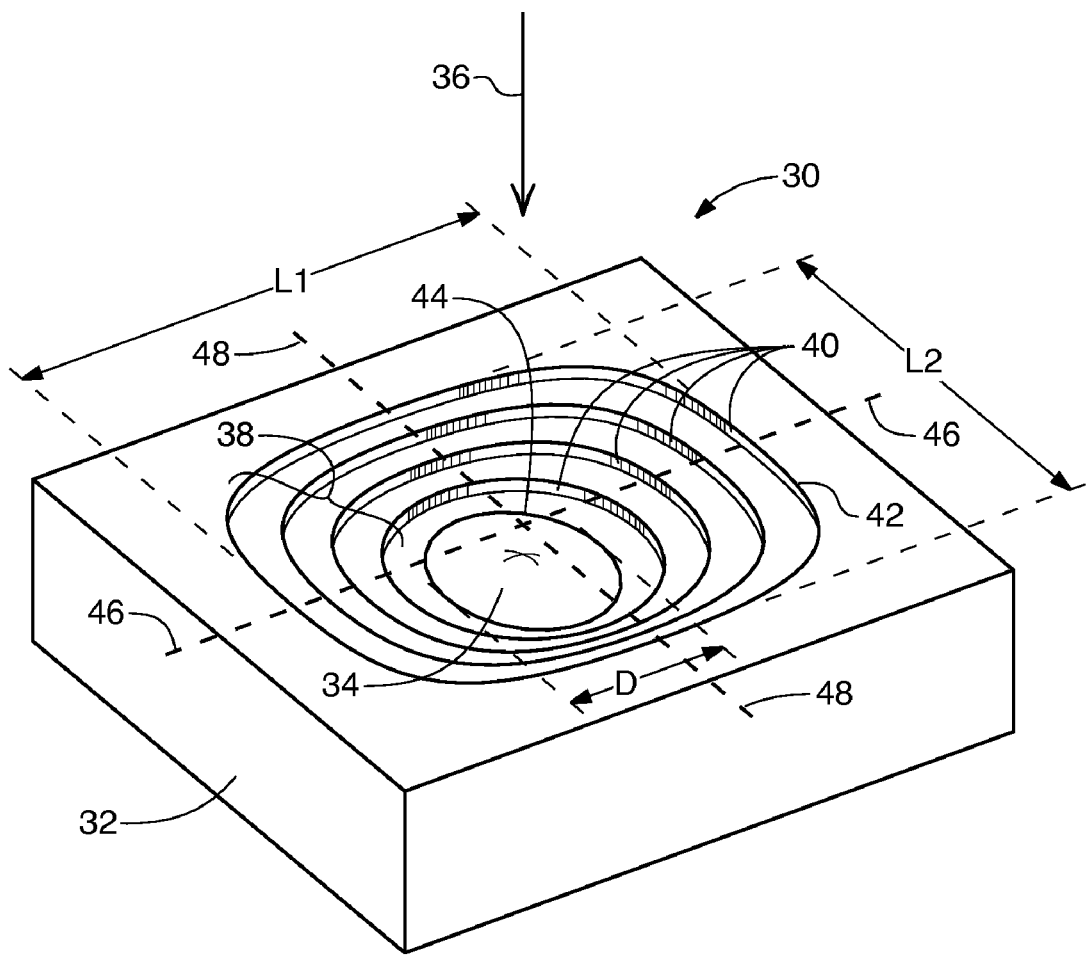
FIG. 2 is a perspective view of a camera module with a lens shielding structure in accordance with an embodiment of the present invention.

A camera module having a lens shielding structure that addresses this shortcoming of conventional lens shielding structures is shown in FIG. 2. The camera module in FIG. 2 has a lens shielding structure that is noncircular and therefore has an asymmetric field of view that can be better matched to the shape of the image sensor to reduce flare. As shown in FIG. 2, camera module 30 may have a camera module housing 32. Housing 32 may be formed from an opaque plastic such as a polymer filled with particles of ceramic or other materials. The material used in forming housing 32 may be selected to provide good rigidity, opacity, temperature stability, and humidity tolerance. This housing may be formed by injection molding, by machining, by deformation using heat and pressure, or using any other suitable fabrication technique.

An image sensor may be mounted at the bottom of camera module housing 32 so that its planar surface lies parallel to the upper surface of housing 32. The image sensor may be formed using any suitable image sensor technology (e.g., charged-coupled device technology, complementary metal-oxide-semiconductor transistor technology, etc.). In a typical arrangement, the sensor may be formed from a rectangular array of image sensor pixels on a silicon substrate. This is, however, merely an illustrative example. Any suitable sensor may be used in camera module 30 if desired.

Camera module 30 may have one or more lenses, such as outermost lens 34. Light may enter lens 34 and any lower-level lenses that, are present in camera module 20 along direction 36. Lens flare is minimized by forming slanted sidewalls. The sidewalk may be formed, in housing 32, in a separate lens shielding structure, or in any other suitable structural member or members associated with module 30. In the example of FIG. 2, lens shielding structure 38 has been formed from step-shaped features 40.

Unlike the conventional lens shielding structure of FIG. 1, lens shielding structure 38 of FIG. 2 is not a simple cone. Lens shielding structure 38 has apertures that are not both circles. In particular, exit aperture 42 has a non-circular barrel shape formed in the exterior planar surface of structure 38, whereas lens aperture 44 has a circular shape formed in the inferior surface of structure 38. The exterior and interior planar surfaces in which apertures 42 and 44 are formed lie parallel to the planar image sensor surface. During operation, light enters the opening formed by apertures 42 and 44 and, after focusing by the camera, module lens, strikes the underlying digital image sensor to form an image.

As shown in FIG. 2, barrel-shaped exit aperture 42 has two different lateral dimensions. Along longitudinal axis 46, lens, shielding, structure 38 has longitudinal dimension L1. Along transverse, axis 48, lens shielding structure 38 has transverse dimension L2. Both L1 and L2 are larger than diameter D of lens aperture 44. The longitudinal axis 46 of lens shielding structure 38 may be aligned with the longer longitudinal axis of the image sensor that is housed in housing 32. As shown in FIG. 2, dimension L1 is longer than dimension L2. As a result, light that is entering lens 34 off axis (i.e., at angles other than along normal axis 36) may enter lens 34 more readily when aligned along longitudinal axis 46 than when oriented parallel to lateral axis 48. A wider angle of acceptance is therefore associated with the longitudinal axis 46 than with transverse axis 48. The azimuthal asymmetry in lens shielding structure 38 and its lens and/or exit apertures (i.e., exit aperture 42 in the FIG. 2 example), therefore allows lens shielding structure 38 to effectively suppress lens flare. With conventional lens shielding structures that treat incident, light from all incoming angles equally, all portions of the lens shielding structure must be constructed to handle the widest desired acceptance angle, leading to an over-acceptance of incoming light rays along the narrower sensor dimension and corresponding undesirable flare.

Figure 3:
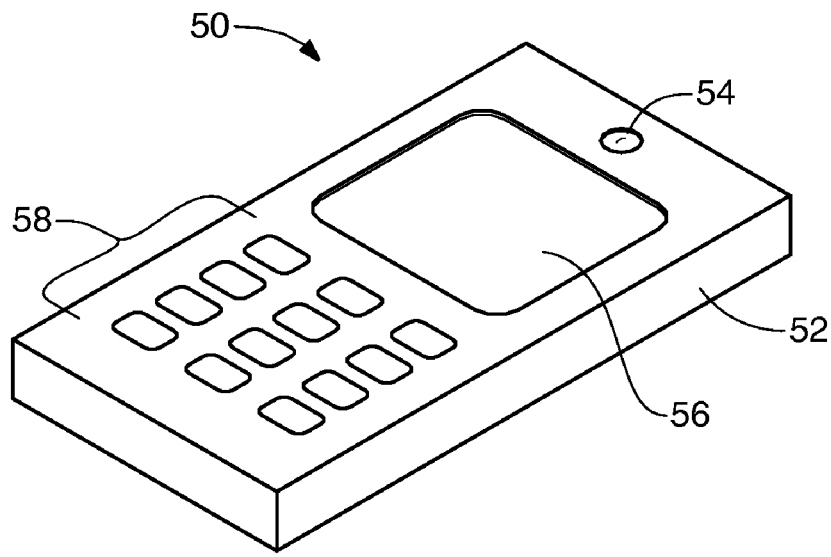
FIG. 3 is a perspective view of an illustrative electronic device in which a camera module with a lens shielding structure, may be used in accordance with an embodiment of the present invention.

Lens shielding structures such as lens shielding structure 38 of FIG. 2 may be used in connection with any suitable image sensors and may be used in any suitable electronic device (e.g., a computer, a set-top box, a camera, a cellular telephone, a computer display, etc.). As an example, lens shielding structure 38 may be used in an electronic device such as electronic device 50 of FIG. 3. As shown in FIG. 3, device 50 may have a housing 52. Housing 52 may be formed from plastic, metal, and other suitable materials. Camera, module 30 may be mounted behind an opening such as opening 54 in housing 52. Device 50 may have input-output components such as keys 58 and display 56. If desired, device 50 may be provided with, cellular telephone circuitry to communicate with remote base stations. Camera module 30 may be used to capture images for device 50. These, images may be transmitted to the remote base station (as an example). Other devices may be used with camera module 30. The example of FIG. 3 is merely illustrative.

Figure 4:
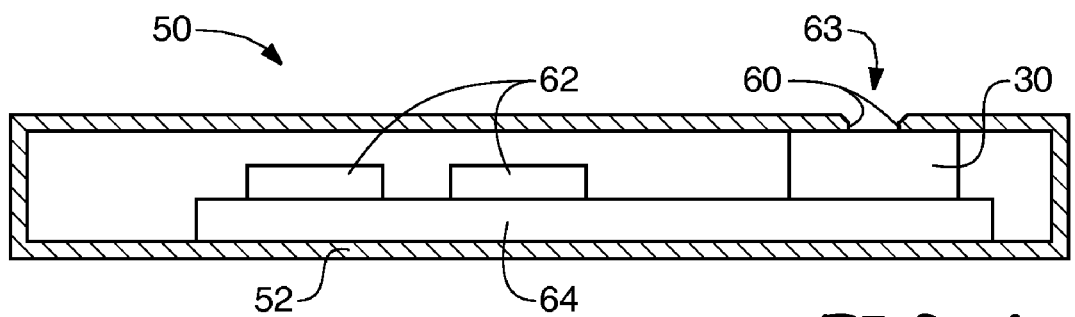
FIG. 4 is across-sectional side view of an illustrative electronic device showing how a camera module may be mounted within the housing of the electronic device in accordance with an embodiment of the present invention.

A cross-sectional view of an illustrative device 50 is shown in FIG. 4. As shown in FIG. 4, camera module 30 may be mounted on a circuit board 64 with integrated circuits and other electronic components 62. Housing 52 may have an opening 63 to allow tight to enter the lens of camera module 30. Opening 63 may have sidewall is 60 that are azimuthally symmetric or, if desired, may have sidewalls that are azimuthally asymmetric and therefore serve as alt or part of tens shielding structure 38. In general, lens shielding structure 38 may be formed from structures that are mounted within housing 32 of module 30, may be formed from housing 32; may be formed from housings 52 of device 50, or may be formed from other suitable structures or combinations of such structures. Arrangements in which lens shielding structure 38 is formed from portions of a camera module housing and arrangements in which lens shielding structure 38 is formed from a separate tens shielding layer are sometimes described, herein as examples. This is, however, merely illustrative. Lens shielding structures, may be formed from am suitable structures if desired.

Figure 5:
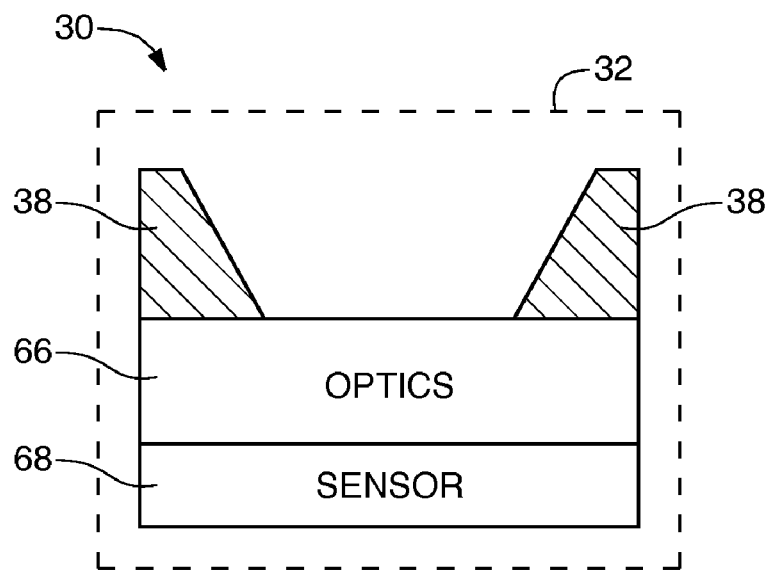
FIG. 5 is a cross-sectional side view of an illustrative camera module structure having a lens shielding structure in accordance with an embodiment of the present invention.

FIG. 5 is a cross-sectional view of an illustrative camera module 30 that has a housing 32. Camera module 30 has an image sensor 68, optical structures 66, and lens shielding structure 38. In the FIG. 5 example, lens shielding structure 38 has been formed within housing 32 (as an example). Sensor 68 may be formed from one or more semiconductor integrated, circuits (e.g., a silicon image sensor chip and optional digital image processing chips). Optical structures 66, which are sometimes referred to as the "lens stack" or "wafer-level optics optical stack" of module 30, may be formed, from one or more wafer-level optics structures (e.g., pieces of transparent wafers such as glass wafers, wafers of plastic or other transparent materials, etc.). For example, optical structures 66 may contain one or more layers of lenses, one or more layers, of optical filters (e.g., infrared blocking filters), anti-reflection coatings, color fitters to provide image sensor 68 with the ability to discriminate between different colors, spacer layers, aperture layers, etc. These layers and structures may be formed using any suitable fabrication techniques such as photolithography, physical vapor deposition, electro-chemical deposition, etching, machining, laser ablation, drilling, heating, stamping, reflowing by application of appropriate temperatures or other heat treatments, ultraviolet (UV) curing of epoxies and other substances, thermal resin curing, chemical curing of epoxies or other viscose: liquid compounds, screen printing, spraying, spin coating, or other suitable manufacturing methods.

In a typical arrangement, silicon image sensors are formed from large arrays of image pixels, on a silicon wafer substrate. Lenses may be formed using replication techniques or photolithography (as examples). With one suitable arrangement, a tool such as a polymer stamp may be used in forming the lenses. The stamp may be pressed against a liquid such as UV curable epoxy or epoxy to be cured using chemical (two-part) or thermal techniques. After the epoxy or other optical material has been cured, to form the desired lens shapes, the stamp may be removed. Stamps and lenses may be formed from materials such as epoxy, polydimethylsiloxane (PDMS), glasses, polymers, etc. Infrared blocking filters may be formed from alternating layers of materials having different indices of refraction such as alternating layers of silicon oxide and titanium oxide (as just one example). Lens apertures may be formed, from metal, alloy layers such as layers of titanium-chromium mixtures. Apertures may also be integrated into the lens stack using other material layers (e.g., layers of visibly opaque polymers, layers of black silicon, etc.). Color filters in the lens stack may be formed from colored dyes.

As shown in the FIG. 5 example, lens shielding structures 38 may be mounted directly to the outermost portion of optical stack 66 (i.e., the outermost lens in the one or more lens layers in stack 66). Optical stack 66 may also be attached to a tens shielding structure formed from housing 32. With one suitable arrangement, the optical structures of stack 66 may be attached to the lens shielding structure using, adhesives (e.g., epoxy). When mounted in this way, the lens elements of the optical stack focus a two-dimensional image onto the image sensor.

Figure 6:
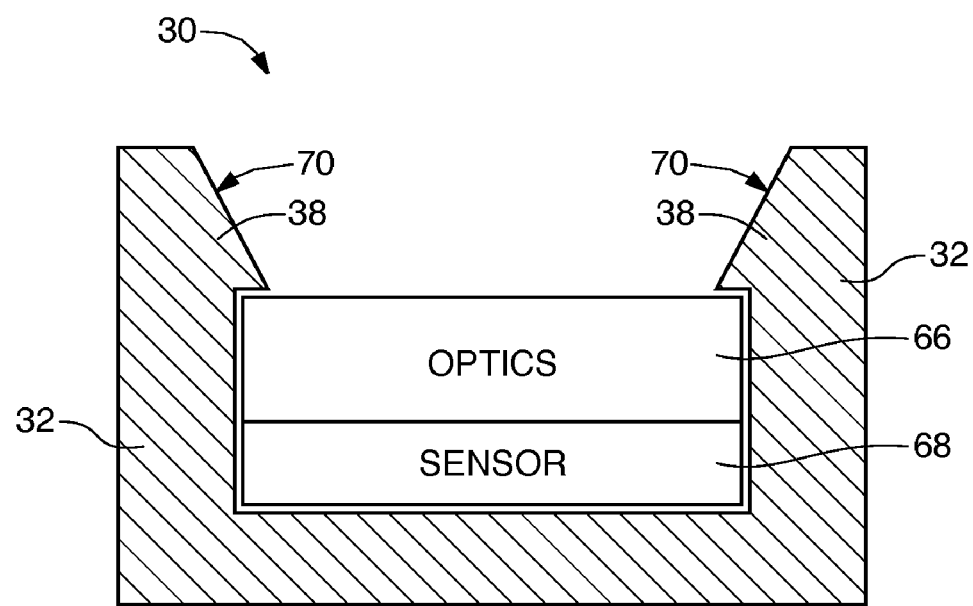
FIG. 6 is a cross-sectional side view of an illustrative, image sensor mounted on a camera module housing with a lens shielding structure in accordance with an embodiment of the present invention.

FIG. 6 is a cross-sectional view of camera module 30 showing how lens shielding structure 38 may be formed as an integral portion of housing 32. FIG. 6 also shows how the sidewalk of lens shielding, structure 38 may be straight, (in cross-section).

Figure 7:
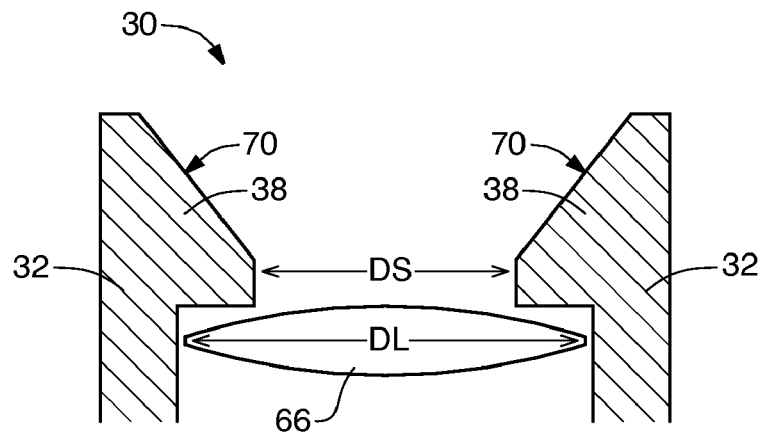
FIG. 7 is a cross-sectional side view of an illustrative lens shielding structure having a lens aperture that has a transverse dimension that is smaller than the diameter of the lens in accordance with an embodiment of the present invention.

In the arrangement of FIG. 7, lens shielding structure sidewalls 70 have a truncated shape. This results in a lens aperture with a smaller (transverse) dimension DS that is less than lens diameter DL. This type of arrangement may be used with sidewalls 70 of any suitable shape.

Figure 8:
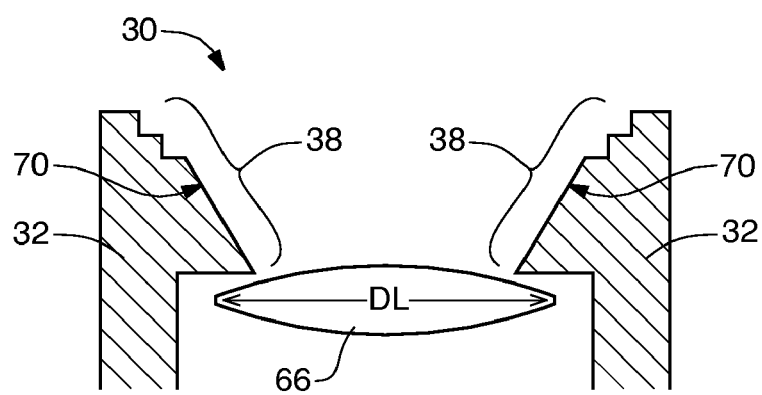
FIG. 8 is a cross-sectional side view of an illustrative lens shielding structure having straight and step-shaped walls in accordance with an embodiment of the present invention.
Figure 9:
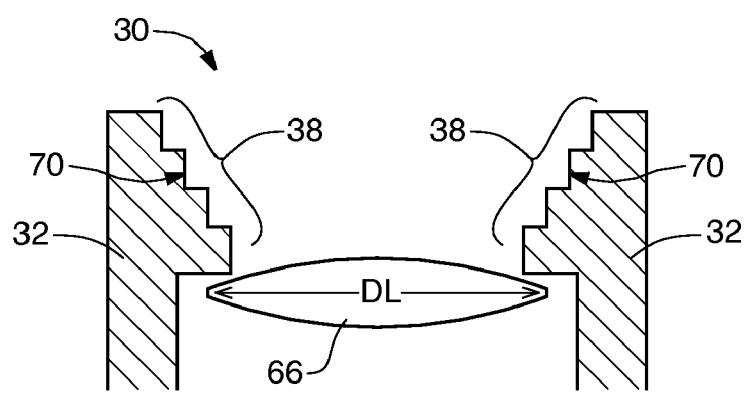
FIG. 9 is a cross-sectional side view of an illustrative lens shielding structure having stepped walls in accordance with an embodiment of the present invention.

The sidewalls 70 of lens shielding structure 38 may have portions that are straight or may be entirely straight. Sidewalls 70 may also have portions that have step-shaped cross-sectional profiles or may be formed entirely from step-shaped structures. FIG. 8 shows how the sidewalls 70 of lens shielding structure 38 may have some portions that are straight and some portions that have step-shaped cross-sectional profiles. In the FIG. 9 arrangement, sidewalls 70 in lens shielding structure 38 are formed substantially of step-shaped structures.

Figure 10:
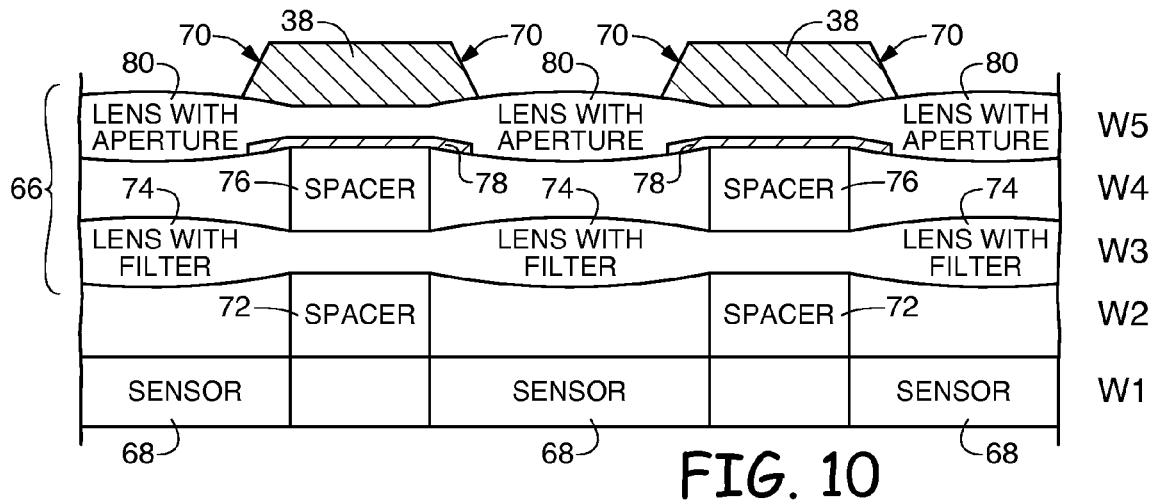
FIG. 10 is a cross-sectional side view showing how wafers of optical and semiconductor materials may form camera modules using wafer scale optics techniques in accordance with an embodiment of the present invention.

FIG. 10 shows how camera modules may be formed from wafers of sensor and optical structures. In the FIG. 10 example, lowermost wafer W1 is a silicon wafer that has been used to form sensors 68. Wafer W2 contains spacers 72. Wafer W3 contains lenses 74 and associated, filters (e.g., color filters and/or infrared blocking filters, etc.). Water W4 is used in forming spacers 76, Wafer W5 is used in forming lens element 80 with associated apertures 78. The FIG. 10 example is merely Illustrative. Camera modules can be formed using wafer level optics fabrication techniques that involve fewer wafers or more wafers. For example, more layers of lenses may be provided in optical stack 66 if desired. Following assembly of the wafers of FIG. 10, the wafers can be diced and packaged in corresponding housings 32 to form individual camera modules 30. If desired, a wafer of opaque material (e.g., a plastic or glass wafer) may be attached to the top of optical stack 66 before dicing the wafers. The wafer of opaque material may have holes that form lens shielding structures 38 and associated sidewalls 70 for each of the camera modules. The holes may be formed using any suitable fabrication technique. For example, the lens shielding structures may be formed in a wafer of opaque material using embossing (molding) techniques, in which a pattern of lens shielding holes is impressed in the lens shielding wafer by appropriately shaped asymmetric pins in an embossing tool. The material that is molded in this way may be healed (i.e., a hot embossing process may be used). Other illustrative techniques that may be used include resin transfer molding and infection molding). These types of wafer-level-optics arrangements may be used to form water-level-optics lens shielding structures or, if desired, lens shielding structures may be formed using other techniques.

It is not necessary for the holes; in the wafer of lens shielding structure material to all have the same size and shape. For example, there may be groups of different lens hood, shapes on a given wafer. This type of arrangement may be used for forming multi-channel image modules, where each imaging channel is provided with its own customized, lens and lens hood. In multi-channel imaging modules of this type, a module may create its output by combining information collected from several imaging channels. In a typical configuration, there may be a lens for each imaging channel and a corresponding imager array for each channel. Optical structures for this type of structure may be constructed using wafer-level-optics techniques. The corresponding imager arrays may be integrated onto a common silicon die on a silicon wafer.

Figure 11:
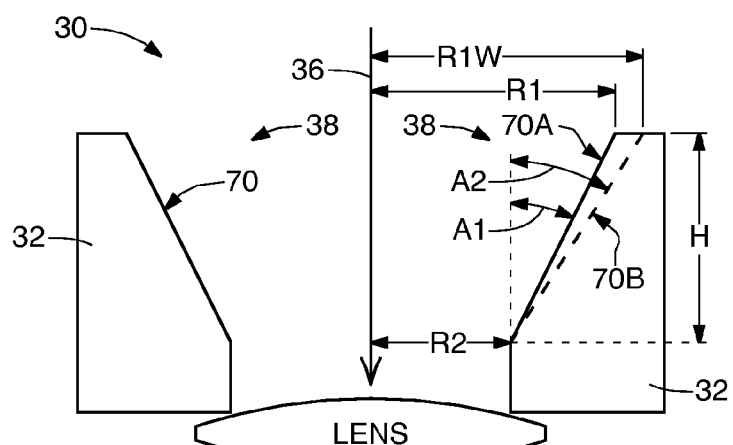
FIG. 11 is a cross-sectional side view of a lens shielding structure and a camera module lens showing angles and aperture widths associated with the lens shielding structure in accordance with an embodiment of the present invention.

Lens shielding structures 38 may have sidewalls such as sidewall 70A and 70B of FIG. 11. These two types of sidewalls are overlaid in the diagram of FIG. 11 for comparison. As shown in FIG. 11, sidewalls such; as sidewalls 70A make a smaller angle (angle A1) with respect, to normal axis 36 than sidewalls 70B. (Angles 70A and 70B are typically in the range of about 10-45°). As a result of the larger size of angle A2, sidewalls 70B are associated with a wider field of view for incoming light. By aligning walls 70B with longitudinal axis 46 (FIG. 2), more light will be accepted along longitudinal axis 46 and less light will be accepted along axis 48 (FIG. 2). The rectangular image sensor 68 can be aligned so that its larger dimension lies parallel to longitudinal axis 46 of lens shielding structure 38. This matches the light acceptance pattern of the lens shielding structures 38 with that required, by sensor 68, so that lens flare can be reduced without blocking incoming, light for any portion of the sensor area that is within the required field of view of the lens.

With one suitable arrangement, lens shielding structure 38 may have a rectangular exit aperture and a circular lens aperture adjacent to the lens. The circular lens aperture may have, for example, a dimension R2 (i.e., a radius) of about 0.5 mm (as an example). Lens shielding structure 38 may have a height H of about 0.5 mm to 2 mm. The rectangular exit aperture may have a rectangular opening with dimension R1 (the smaller side) b. R1W (the larger side). In this type of configuration, dimension R1 will be about 0.8 to 1.8 mm. In the perpendicular dimension (i.e., into the page of FIG. 11, dimension R1W may be about 0.9 to 2.2 mm when H is 0.5 to 2 mm (as an example). In general R1 (R1W) will, be equal to R2+H*tan A1 (A2). Any suitable height H may be used for structure 38. The use of thicker lens shielding layers will provide better light shielding.

Figure 12:
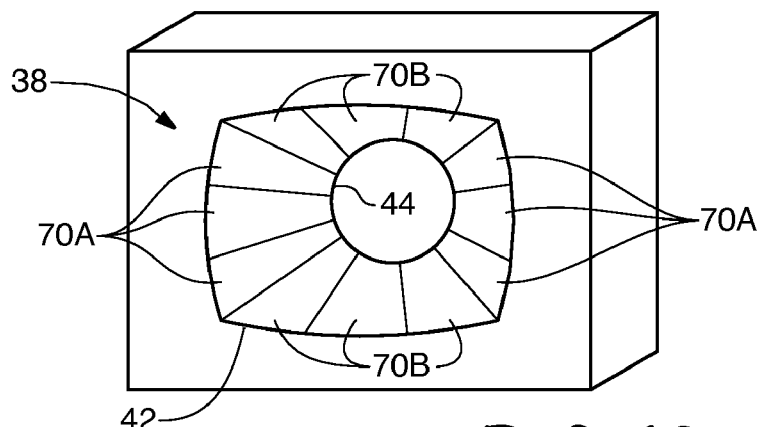
FIG. 12 is a perspective view of an illustrative lens shielding structure having a barrel-shaped exit aperture in its exterior surface and a circular lens aperture in its interior surface in accordance with an embodiment of the present invention.

As shown in FIG. 12, exit, aperture 42 of lens hood structure 38 may have a barrel shape that optimally accommodates light rays traveling into a rectangular sensor 68 while suppressing flare. Inner aperture 44 may be circular (as an example).

Figure 13:
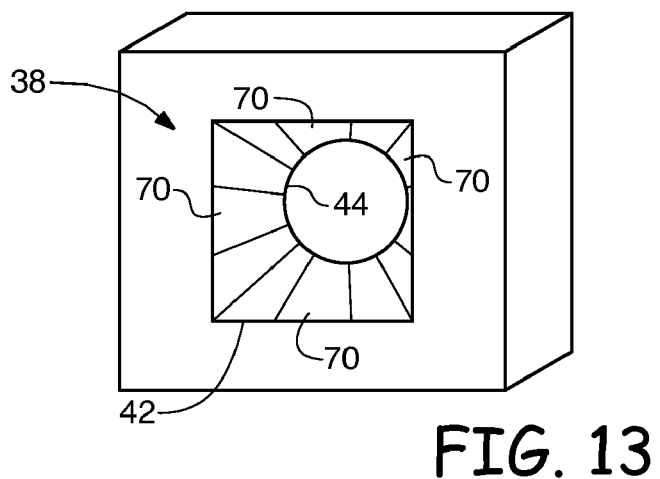
FIG. 13 is a perspective view of an illustrative lefts shielding structure having a rectangular exit aperture and a circular lens aperture in accordance with an embodiment of the present invention.

Another possible arrangement is shown in FIG. 13. In the FIG. 13 configuration, lens aperture 44 is circular and exit aperture 42 is square.

Figure 14:
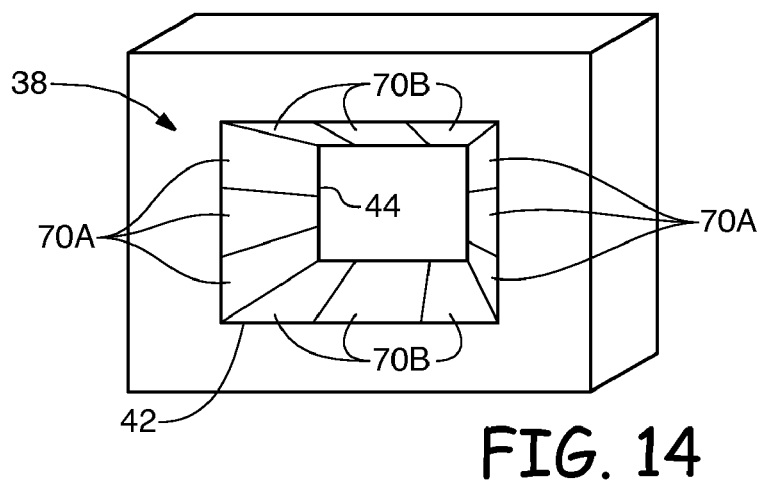
FIG. 14 is a perspective view of an illustrative lens shielding structure having a rectangular exit aperture and a rectangular lens aperture in accordance with an embodiment of the present invention.

If desired, an arrangement of the type, shown in FIG. 14 may be used in which lens aperture 44 is rectangular and exit aperture 42 is also rectangular (e.g., if the lens has its own circular aperture layer and that circular aperture layer is light prove and axially close to lens aperture 44).

In general, any suitable shape may be used for the innermost aperture of lens shielding structure 38 and the outermost aperture of lens shielding structure 38. Sidewalls 70 of suitable shapes may be used to smoothly transition, between these two respective aperture shapes. As described in connection with FIGS. 6, 7, 8, and 9, the sidewalls may be straight, step-shaped, or may have combinations of such shapes. When the sidewalls are straight in cross-section, the upper end of each straight sidewall segment will originate at a point on the perimeter of the exit aperture and the corresponding lower end of the straight sidewall segment will terminate at an associated point on the perimeter of the lens aperture. The resulting shape of the inner surface of lens shielding structure 38 will be smooth and will evenly transition between the opening used for the exit aperture and the opening used for the lens aperture.

Figure 15:
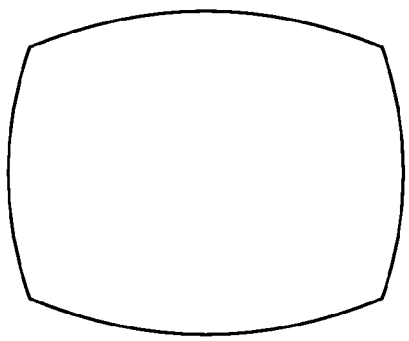
FIGS. 15, 16, 17, 18, 19, 20, 21, and 22 show illustrative shapes that may be used for exit apertures and lens apertures in lens shielding structures in accordance with embodiments of the present invention.

FIG. 15 shows a barrel shaped opening that may be used for aperture 14 or aperture 44.

Figure 16:
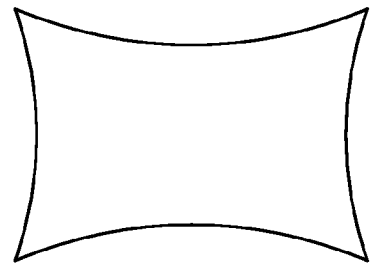

FIG. 16 shows a pincushion shaped opening that may be used for one of these apertures.

Figure 17:
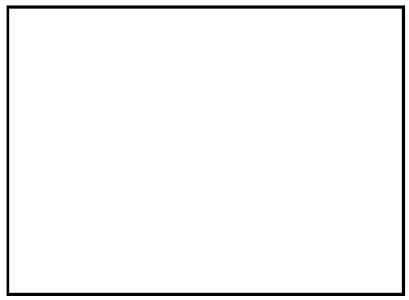

As shown in FIG. 17, either of the apertures may have a rectangular shape with unequal sides.

Figure 18:
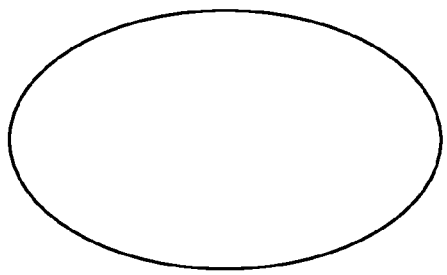

FIG. 18 shows how aperture 42 or aperture 44 may have an oval shape.

Figure 19:
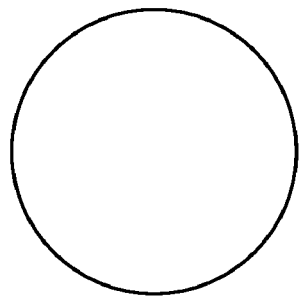

FIG. 19 shows how aperture 42 or aperture 44 may have a circular shape.

Figure 20:
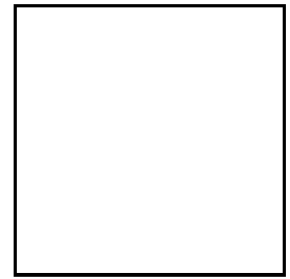

FIG. 20 shows how aperture 42 or aperture 44 may have a square shape.

Figure 21:

If desired, the corners of apertures 42 and 44 may be rounded. Rounded corners may be provided, for example, when using shapes such as the aperture shapes of FIGS. 15, 16, 17, and 20. An example is shown in FIG. 21. In the FIG. 21 example, the corners of a rectangular aperture are rounded, as if a circular shape had rolled around a rectangle and used to "draw" the outermost limits of the aperture boundary.

Figure 22:
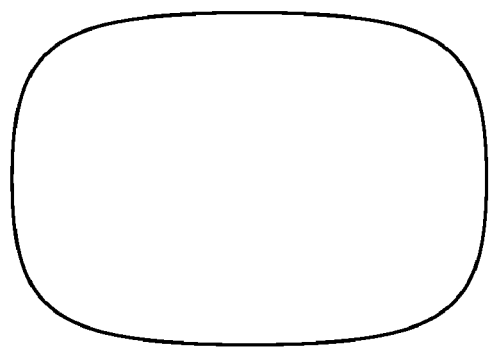

FIG. 22 shows how a barrel-shaped aperture such as the aperture of FIG. 15 may be provided with rounded corners.

Conclusion

As described in the foregoing, typical digital image sensors are square or rectangular and have a large array of image sensor pixels arranged in rows and columns. Particularly in digital camera modules in which the digital image sensor has a rectangular active area, it can be helpful to form a lens hood structure from a layer of opaque material having a noncircular exterior aperture that results in a rectangular-like field of view. In these configurations, more of the rays of light that contribute to lens flare can be blocked than would be possible when using a lens hood structure with a circular exit aperture, thereby efficiently reducing lens flare. Barrel shape exit apertures may, in some situations, provide optimal flare reduction, hut other noncircular shapes having longitudinal dimensions larger, than their transverse dimensions may also be used if desired (e.g., rectangles, rectangles with rounded corners, ovals, pincushion shapes, combinations of these shapes, etc.).

The lens shielding, structures can be used to reduce flare in compact, camera modules. The compact camera modules can be formed using water-level-optics structures. Optical stack structures may be formed from wafers of transparent lens material and wafers of spacers. Filters such as infrared, blocking filter, metal aperture layers, and other optical components may be integrated into, the optical stack structures. The fabrication of the optical stacks, from wafers of material allows high manufacturing, efficiencies to be achieved. Finished, optical stacks can be formed by dicing the wafers into individual pieces. As part of the wafer-level manufacturing operations that are used in forming the wafer-level-optics optical, stack structures or as part of a packaging process in which the optical stack structures are mounted in a housing, the camera modules can be provided with flare-reducing lens hood structures.

The lens hood structures can be formed from a wafer of opaque material such as wafer of plastic having leas hood openings or may be formed by providing camera module housings with lens hood openings. Each lens hood structure has an exterior surface in which, an exterior surface aperture for the lens hood opening is formed. Each lens hood structure also has an inner surface in which an interior surface tens hood aperture is formed. The inner lens hood aperture may be located adjacent to the outermost lens in the optical stack structure of the camera module. The optical stack structure may be mounted above a digital image sensor.

The digital image sensor may have a rectangular active area. To reduce flare effectively, particularly in camera modules having rectangular digital image sensors, the lens hood opening may be provided with an asymmetrical configuration. With this type of arrangement, the exterior surface lens hood aperture may have a noncircular shape such as a barrel shape, rectangular shape, oval shape, or other noncircular shape. With exterior surface aperture shapes such as these, the exterior surface aperture has a longitudinal dimension that is larger than its transverse dimension. The larger longitudinal dimension of the exterior surface aperture can be aligned with the larger of the two lateral image sensor dimensions.

The lens shielding structures may in general, have any suitable three-dimensional shape and size within a layer of non-transparent material so that the field of view of the lens shielding structure is matched to the size, shape, and divergence of the field of view at the position of the lens to which the lens shielding structure is mounted.

The foregoing is merely illustrative of the principles of this invention and various modifications can be made by those skilled in the art if desired.

What is claimed is:

1. A camera module, comprising:
    a digital image sensor;
    a stack of optical layers on the digital image sensor, including an outermost lens layer; and
    a layer of opaque lens hood material disposed above the outermost lens layer and having an opening through which light reaches the digital image sensor, wherein the layer of lens hood material comprises:
        an outermost surface in which a noncircular exit aperture for the opening is formed; and
        an innermost surface in which a circular lens aperture for the opening is formed, wherein the innermost surface is located between the outermost surface of the layer of lens hood material and the outermost lens layer of the stack of optical layers.

2. The camera module defined in claim 1 further comprising a housing in which the digital image sensor and the stack of optical layers are mounted, wherein the lens hood material comprises a portion of the housing.

3. The camera module defined in claim 1 wherein the stack of optical layers comprises a plurality of wafer-level-optics (WLO) lens layers including the outermost lens layer.

4. The camera module defined in claim 3 wherein the layer of opaque lens hood material comprises a portion of a wafer of opaque lens hood material.

5. The camera module defined in claim 1 wherein the exit aperture comprises an opening in the layer of lens hood material having a shape selected from the group consisting of: an oval, a barrel, a pincushion, and a rectangle with unequal sides.

6. The camera module defined in claim 1 wherein the noncircular exit aperture has a first perimeter, wherein the circular lens aperture has a second perimeter, and wherein the layer of lens hood material further comprises:
    at least one intermediate surface located between the outermost and innermost surfaces of the layer of lens hood material, wherein the at least one intermediate surface has an opening with a third perimeter and wherein the third perimeter lies between the first and second perimeters.

7. A digital image sensor structure, comprising:
    a digital image sensor;
    a lens that focuses light onto the digital image sensor to form a two-dimensional image that is sensed by the digital image sensor, wherein the lens is formed in a wafer-level-optics optical stack that is disposed above the digital image sensor; and
    an opaque layer mounted above the lens that has an opening that reduces lens flare in the lens, wherein the opaque layer has an outermost surface in which a noncircular exit aperture for the opening is formed and has an innermost surface in which a lens aperture for the opening is formed adjacent to the lens, wherein the noncircular exit aperture has a first noncircular shape and a first size, wherein the lens aperture has a second shape and a second size, and wherein the second shape and second size are different from the first noncircular shape and first size.

8. The digital image sensor structure defined in claim 7 wherein the opening in the opaque layer is configured so that the noncircular exit aperture is barrel shaped.

9. The digital image sensor structure defined in claim 7 wherein the opening in the opaque layer is configured so that the lens aperture is circular.

10. The digital image sensor structure defined in claim 7 wherein the opening in the opaque layer is configured so that the first noncircular shape of the noncircular exit aperture is selected from the group consisting of: a rectangle with unequal side lengths, an oval, a pincushion shape, and a barrel.

11. The digital image sensor structure defined in claim 10 wherein the opening in the opaque layer is configured so that the noncircular exit aperture has rounded corners.

12. The digital image sensor structure defined in claim 7 wherein the opaque layer comprises a layer of opaque plastic having slanted sidewalls that form a smooth transition between the noncircular exit aperture and the lens aperture.

13. The digital image sensor structure defined in claim 7 wherein the opaque layer comprises a layer of opaque plastic having stepped sidewalls between the noncircular exit aperture and the lens aperture, wherein the digital image sensor has a planar surface, and wherein the outermost surface is planar and is parallel to the planar surface of the digital image sensor.

14. The digital image sensor structure defined in claim 7 wherein the opaque layer comprises a portion of a housing in which the digital image sensor is mounted, wherein the lens comprises one of a plurality of lenses formed from transparent wafer layers in the wafer-level-optics optical stack, wherein the stack comprises at least one infrared blocking filter, at least one metal lens aperture layer, and at least one spacer layer, and wherein the opaque layer comprises a layer of material selected from the group consisting of: a metal and an opaque polymer film.

15. The digital image sensor structure defined in claim 7 wherein the opaque layer comprises:
    a plurality of intermediate surfaces located between the noncircular exit aperture and the lens aperture of the opaque layer, wherein each intermediate surface in the plurality of intermediate surfaces has one of a plurality of differently shaped openings that transition smoothly from the first noncircular shape of the noncircular exit aperture to the second shape of the lens aperture and wherein each intermediate surface in the plurality of intermediate surfaces has one of a plurality of differently sized openings that transition smoothly from the first size of the noncircular exit aperture to the second size of the lens aperture.

16. The digital image sensor structure defined in claim 7 wherein the opaque layer comprises:
    a plurality of intermediate surfaces located between the noncircular exit aperture and the lens aperture of the opaque layer, wherein each intermediate surface in the plurality of intermediate surfaces has one of a plurality of differently shaped openings that transition in steps from the first noncircular shape of the noncircular exit aperture to the second shape of the lens aperture.

17. A camera module, comprising:
    a digital image sensor having a rectangular sensor area with sides of unequal length;
    a wafer-level-optics optical stack structure disposed above the digital image sensor, wherein the optical stack structure includes a plurality of lens layers formed from pieces of wafers; and
    a lens shielding structure formed from at least one layer of material mounted above the optical stack structure, wherein the lens shielding structure has an exterior surface with a noncircular exterior surface lens hood aperture, wherein the layer of material has an inner surface with an inner surface lens hood aperture that is adjacent to one of the lens layers, wherein the noncircular exterior surface lens hood aperture has a first noncircular shape, wherein the inner surface lens hood aperture has a second shape, and wherein the second shape is different from the first noncircular shape.

18. The camera module defined in claim 17 wherein the layer of material is configured so that the noncircular exterior surface lens hood aperture has a longitudinal dimension and a transverse dimension that lie in a common plane with the exterior surface and wherein the longitudinal dimension is larger than the transverse dimension.

19. The camera module defined in claim 18 wherein the layer of material comprises an opaque plastic layer and wherein the noncircular exterior surface lens hood aperture is substantially barrel shaped.

20. The camera module defined in claim 17 wherein the layer of material comprises:
 a plurality of intermediate surfaces located between the noncircular exterior surface lens hood aperture and the inner surface lens hood aperture, wherein each intermediate surface in the plurality of intermediate surfaces has one of a plurality of differently shaped openings that transition from the first noncircular shape of the noncircular exterior surface lens hood aperture to the second shape of the inner surface lens hood aperture.

\* \* \* \* \*